US008476659B2

United States Patent
Hsia et al.

(10) Patent No.: US 8,476,659 B2
(45) Date of Patent: Jul. 2, 2013

(54) LIGHT EMITTING DEVICE

(75) Inventors: Hsing-Kuo Hsia, Jhubei (TW);
Hung-Weng Huang, Hsinchu (TW);
Ching-Hua Chiu, Hsinchu (TW);
Gordon Kuo, Taipei (TW)

(73) Assignee: TSMC Solid State Lighting Ltd.,
Hsinchu (TW)

( * ) Notice: Subject to any disclaimer, the term of this patent is extended or adjusted under 35 U.S.C. 154(b) by 212 days.

(21) Appl. No.: 12/837,227

(22) Filed: Jul. 15, 2010

(65) Prior Publication Data

US 2012/0012871 A1  Jan. 19, 2012

(51) Int. Cl.
*H01L 33/00* (2010.01)
*H01L 21/00* (2006.01)

(52) U.S. Cl.
USPC 257/98; 257/99; 257/E21.521; 257/E33.068; 438/16; 438/27; 438/33

(58) Field of Classification Search
USPC ......... 257/98, 99, E21.521, E33.068; 438/16, 438/26, 27, 33
See application file for complete search history.

(56) References Cited

U.S. PATENT DOCUMENTS

| | | | | |
|---|---|---|---|---|
| 7,629,195 B2 * | 12/2009 | Tran et al. | ......... | 438/52 |
| 7,691,656 B2 * | 4/2010 | Bader et al. | ......... | 438/29 |
| 7,768,754 B2 * | 8/2010 | Collins et al. | ......... | 361/56 |
| 2002/0003428 A1 * | 1/2002 | Freund et al. | ......... | 324/750 |
| 2003/0020897 A1 * | 1/2003 | Griffiths et al. | ......... | 356/73 |
| 2007/0029541 A1 * | 2/2007 | Xin et al. | ......... | 257/14 |
| 2009/0179210 A1 * | 7/2009 | Cok | ......... | 257/98 |
| 2009/0242918 A1 * | 10/2009 | Edmond et al. | ......... | 257/98 |
| 2011/0039360 A1 * | 2/2011 | Bour et al. | ......... | 438/29 |
| 2011/0101393 A1 * | 5/2011 | Hsu et al. | ......... | 257/98 |
| 2011/0132521 A1 * | 6/2011 | Paolini et al. | ......... | 156/67 |

\* cited by examiner

*Primary Examiner* — Tuan N. Quach
(74) *Attorney, Agent, or Firm* — Haynes and Boone, LLP (57) ABSTRACT

The present disclosure relates to methods for performing wafer-level measurement and wafer-level binning of LED devices. The present disclosure also relates to methods for reducing thermal resistance of LED devices. The methods include growing epitaxial layers consisting of an n-doped layer, an active layer, and a p-doped layer on a wafer of a growth substrate. The method further includes forming p-contact and n-contact to the p-doped layer and the n-doped layer, respectively. The method further includes performing a wafer-level measurement of the LED by supplying power to the LED through the n-contact and the p-contact. The method further includes dicing the wafer to generate diced LED dies, bonding the diced LED dies to a chip substrate, and removing the growth substrate from the diced LED dies.

20 Claims, 13 Drawing Sheets

LIGHT EMITTING DEVICE

BACKGROUND

Light emitting diodes (LEDs) are P/N diodes that emit light when voltages are applied across the P/N junctions. Traditional methods of fabricating LEDs consist of growing and patterning epitaxial layers of semiconductor materials on a wafer having a growth substrate, such as sapphire, using semiconductor manufacturing processes. After growing the epitaxial layers, the wafer is diced into dies and the dies are bonded to supporting structures, like lead-frames, for measurement of their optical and electrical properties. Measured LED dies are sorted, or binned, in accordance with their measured properties and those dies with the desired properties are packaged into LED chips.

While existing methods of fabricating LEDs have generally been adequate for their intended purposes, they have not been entirely satisfactory. For example, measurements of the diced LED dies, known as chip-level binning, incur extra manufacturing time and cost, and therefore is not suitable for mass production. In addition, the growth substrate of the LED dies, such as sapphire of a conventional LED or copper of a vertical LED, though suitable for growing the epitaxial layers, may have high thermal resistance. The high thermal resistance impairs the heat dissipation capability of the LED chips, degrading their performance and increasing the power. Accordingly, there is a need for LED fabrication methods that reduce manufacturing cost and increase performance of the LED chips.

SUMMARY

In accordance with one or more embodiments of the present disclosure, a method for fabricating a light emitting diode (LED) is disclosed. The method includes growing epitaxial layers consisting of an n-doped layer, an active layer, and a p-doped layer on a wafer of a growth substrate. The method further includes forming a p-contact and an n-contact to the p-doped layer and the n-doped layer, respectively. The method further includes performing a wafer-level measurement of the LED by supplying power to the LED through the n-contact and the p-contact. The method further includes dicing the wafer to generate diced LED dies, bonding the diced LED dies to a chip substrate, and removing the growth substrate from the diced LED dies.

In accordance with one or more embodiments of the present disclosure, a method of binning a light emitting diode (LED) is disclosed. The method includes fabricating the LED on a wafer. The method further includes forming probe contacts to supply test power to perform wafer-level binning of the LED and performing wafer-level binning of the LED. The method further includes dicing the wafer to generate diced LED dies, bonding the diced LED dies to a chip substrate, and forming contact electrodes to supply operational power to the diced LED dies.

In accordance with one or more embodiments of the present disclosure, a method of fabrication for improving thermal dissipation of a LED is disclosed. The method includes fabricating the LED on a wafer of growth substrate. The method further includes patterning the LED to form probe contacts and performing a wafer-level measurement of the LED using the probe contacts. The method further includes dicing the wafer to yield a diced LED die. The method further includes bonding the diced LED to a chip substrate having a higher thermal conductivity than a thermal conductivity of the growth substrate. The method further includes removing the growth substrate from the chip substrate.

In accordance with one or more embodiments of the present disclosure, an LED with improved thermal dissipation is disclosed. An LED die is fabricated on a wafer of growth substrate. The LED die includes probe contacts for performing a wafer-level measurement of the LED. The LED die is bonded to a chip substrate having a higher thermal conductivity than a thermal conductivity of the growth substrate, which is then removed from the chip substrate to form the LED.

These and other embodiments of the present disclosure will be more fully understood by reference to the following detailed description when considered in conjunction with the following drawings.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION OF THE EMBODIMENT(S)

The present disclosure relates to methods for performing wafer-level measurement and wafer-level binning of LED devices. The present disclosure also relates to methods for reducing thermal resistance of LED devices. It is understood that the present disclosure provides many different forms and embodiments, and that specific embodiments are provided only as examples. Further, the scope of the present disclosure will only be defined by the appended claims. In the drawings, the sizes and relative sizes of layers and regions may be exaggerated for clarity. It will be understood that when an element or layer is referred to as being "on," "connected to" or "coupled to" another element or layer, it may be directly on, connected to, or coupled to the other element or layer, or intervening elements or layers may be present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may likewise be interpreted accordingly.

Hereinafter, embodiments of the present invention will be explained in detail with reference to the accompanying drawings.

Figure 1:
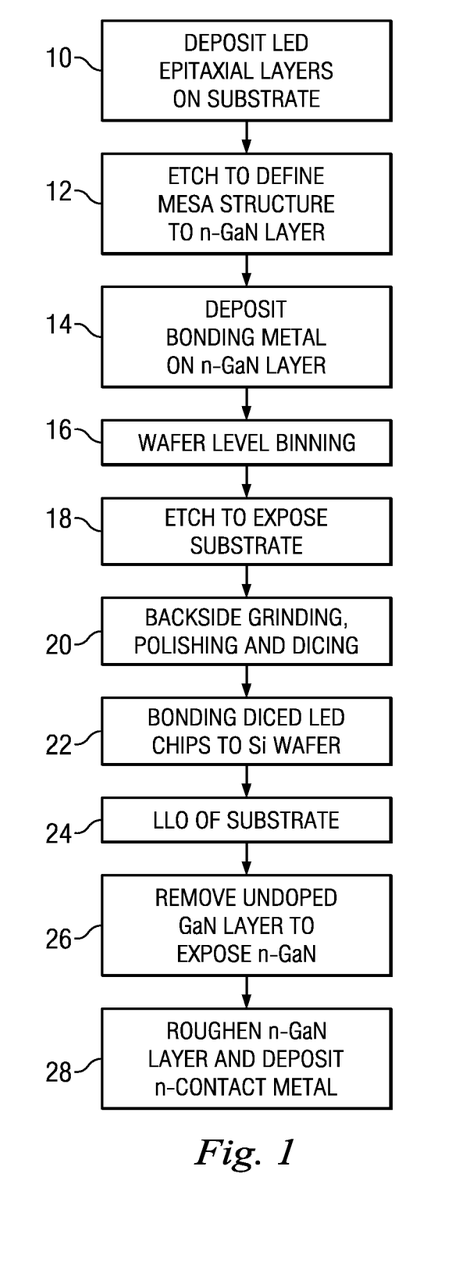
FIG. 1 shows a flowchart of a method for fabricating a semiconductor LED with wafer-level binning according to one or more embodiments of the present disclosure.

FIG. 1 shows a flowchart of a method for fabricating semiconductor LED devices with wafer-level binning according to one or more embodiments of the present disclosure. The method performs wafer-level measurement and wafer-level binning of LED dies before fabrication of the LED is completed to reduce cost. The method also allows the epitaxial layers of the LED dies to be grown on any substrate because the substrate is eventually removed and the LED dies bonded with a silicon substrate to improve the thermal conductivity of the dies. The bonded silicon substrate may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors.

In step 10, epitaxial layers for forming the LED dies are deposited on a wafer of growth substrate. The epitaxial layers may be deposited by a process such as metal organic chemical vapor deposition (MOCVD). To form gallium nitride (GaN) LED, the deposited layers may consist of an un-doped GaN layer, an n-doped GaN layer (n-GaN), a multiple quantum well (MQW) active layer, a p-doped GaN layer (p-GaN), a p-contact metal layer, and a reflective mirror layer. In step 12, the p-contact and reflective mirror layers are patterned to form p-contacts for the LED dies. The epitaxial layers are further etched to define mesa structures down to the n-GaN using an etching process such as inductively coupled plasma (ICP).

In step 14, bonding metal is grown on the surface of the mesa structures to connect to the p-contacts for subsequent wafer-level measurement of the LED dies. The bonding metal is also used to bond diced LED dies to a silicon substrate in a subsequent step. Bonding metal is also deposited on the exposed n-GaN layer and patterned to form n-contacts for the wafer-level measurement. In step 16, wafer-level measurements of the LED dies are performed using the p-contacts and the n-contacts to characterize the dies for binning. Measurements may include measuring the luminance level of the emitted light, and measuring electrical characteristics of the LED dies such as voltage and power. The measurements are mapped for the LED dies on the wafer so that after the dies are diced they may be sorted and binned in accordance with their measured properties. Measurements of the LED dies at the wafer level allow for advanced analysis of the distribution of the characterization data of the LED dies. Thus, dies with similar measured properties from different wafers may be selected for bonding to a common substrate of silicon wafer.

In step 18, a second etching process is performed on the LED dies to expose the growth substrate. In step 20, the side of the growth substrate opposite the epitaxial layers, commonly referred to as the backside, is grinded and polished to reduce the thickness of the growth substrate. The wafer is then diced and binned to yield diced LED chips sorted by their measured properties from the wafer-level measurement. In step 22, diced LED chips with the desired properties are flipped and bonded to a substrate of silicon wafer. The silicon substrate has a higher thermal conductivity than that of the growth substrate to improve thermal dissipation of the LED chips. The silicon substrate may include other microelectronic devices and supporting circuitries. Since only sorted LED chips with the desired characteristics are bonded to the silicon substrate, the LEDs may be bonded in various configurations to substrates of various sizes and materials to yield packaged LEDs with the desired functionalities.

In step 24, a laser lift-off (LLO) is performed on the growth substrate to remove the growth substrate altogether. Removal of the growth substrate exposes the un-doped GaN layer. In step 26, a layer of dielectric material is used to cap the sidewall of the mesa structures. The un-doped GaN is then removed to expose the n-GaN layer. In step 28, a dielectric layer is also used to protect certain regions of the n-GaN layer and the unprotected regions are roughened by an etching process such as a photo electrochemical etching process using potassium hydroxide (KOH). The roughened n-GaN layer increases light extraction from the LED chips by scattering the emitted light outward and by reducing internal reflection. In step 28, the dielectric layer is removed and n-contact metal is deposited on the protected regions of the n-GaN to form the electrode.

Figure 2:
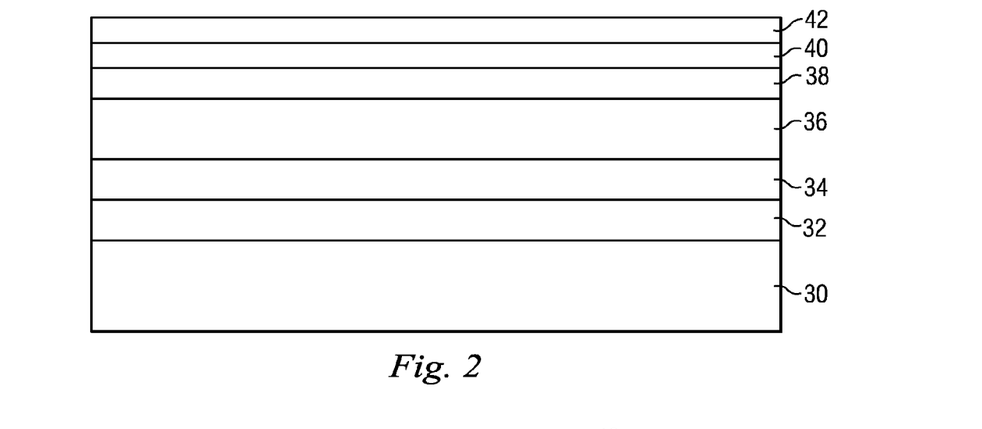
FIG. 2 shows a cross-sectional view of a wafer after depositing the epitaxial layers of LED dies using the method of FIG. 1 according to one or more embodiments of the present disclosure.

FIG. 2 shows a cross-sectional view of a wafer after depositing the epitaxial layers of LED dies using the method of FIG. 1 according to one or more embodiments of the present disclosure. In particular, FIG. 2 shows a cross-sectional view of the epitaxial layers after step 10 of FIG. 1.

A growth substrate 30 suitable for growing LED dies is provided. In the present embodiment, growth substrate 30 may be made of sapphire for growing conventional LED. Alternatively, growth substrate 30 may include silicon carbide, silicon, copper, or another material for growing vertical LED. Growth substrate 30 may have a thickness of 300 um and may be thinned to about 90-100 um through subsequent grinding and polishing, such as in step 20 of FIG. 1. Even though growth substrate 30 may be suitable for growing the epitaxial layers of the LED dies, it may have a higher thermal resistance than is desirable for a packaged LED. Therefore, growth substrate 30 is removed in a later stage of the fabrication method, such as in step 24 of FIG. 1, and replaced with another substrate with a lower thermal resistance.

The epitaxial layers may be deposited by a process such as metal organic chemical vapor deposition (MOCVD), physical vapor deposition (PVD), atomic level deposition (ALD), or other deposition processes. An un-doped GaN layer 32 or a layer of other un-doped semiconductors suitable for the LED dies is deposited on growth substrate 30. An n-doped GaN layer 34 or a layer of other n-type semiconductor materials is deposited on un-doped GaN layer 32. A MQW active layer 36 is deposited on n-doped GaN layer 34. MQW active layer 36 may include alternating (or periodic) layers of GaN and indium gallium nitride (InGaN). For example, in one embodiment, MQW active layer 36 includes at least 7 alternating layers of GaN and InGaN. A p-doped GaN layer 38 or a layer of other p-type semiconductor materials is deposited on MQW active layer 36.

A p-contact metal layer 40 is deposited on p-doped GaN layer 38. P-contact metal layer 40 may include metals that have good conductive properties and are suitable for bonding, such as gold, gold alloy, copper, copper alloy, nickel, nickel alloy, platinum, platinum alloy, titanium, titanium alloy, or combinations thereof. A reflective mirror layer 42 is deposited on p-contact metal layer 40 to reflect emitted light from the LED dies. Reflective mirror layer 42 may include silver, a silver alloy, aluminum, or an aluminum alloy.

When depositing the epitaxial layers, growth substrate 30 acts as a seed crystal, and un-doped GaN layer 32, n-doped GaN layer 34, MQW active layer 36, and p-doped GaN layer 38 take on a lattice structure and an orientation that are substantially identical to those of growth substrate 30. After the completion of the epitaxial growth process, a P/N junction (or a P/N diode) is essentially formed by disposing MQW active layer 36 between n-doped GaN layer 34 and p-doped GaN layer 38. When an electrical voltage (or electrical charge) is applied to n-doped GaN layer 34 and p-doped GaN layer 38, electrical current flows through the LED, and MQW active layer 36 emits light. The color of the light emitted by MQW active layer 36 is associated with the wavelength of the light, which may be tuned by varying the composition and structure of the materials that make up MQW active layer 36.

Figure 3:
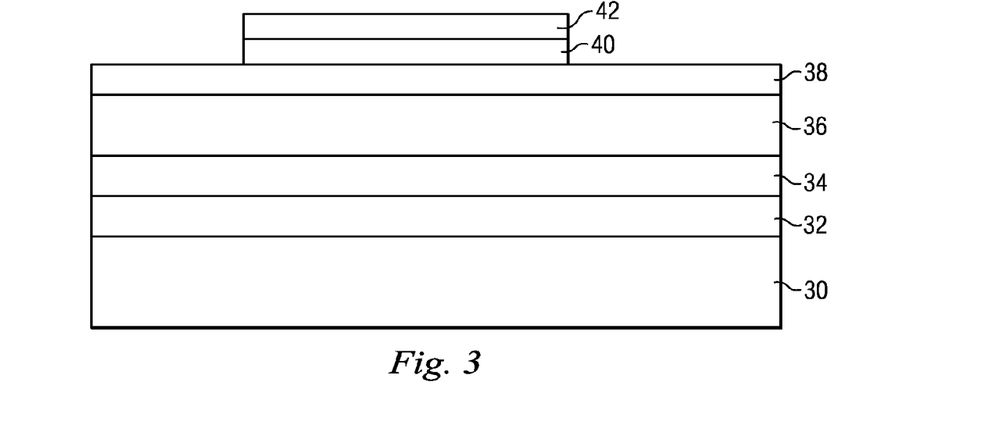
FIG. 3 shows a cross-sectional view of a wafer after patterning a reflective mirror layer and a p-contact metal layer of LED dies using the method of FIG. 1 according to one or more embodiments of the present disclosure.

FIG. 3 shows a cross-sectional view of a wafer after patterning reflective mirror layer 42 and p-contact metal layer 40 of LED dies using the method of FIG. 1 according to one or more embodiments of the present disclosure. Reflective mirror layer 42 and p-contact metal layer 40 are patterned by a photolithography process to form mesa structures. The top surface of the mesa structures are subsequently bonded to a bonding metal layer, such as in step 14 of FIG. 1, to be used as p-contacts for the LED dies. The mesa structures initially only expose p-doped GaN layer 38.

Figure 4:
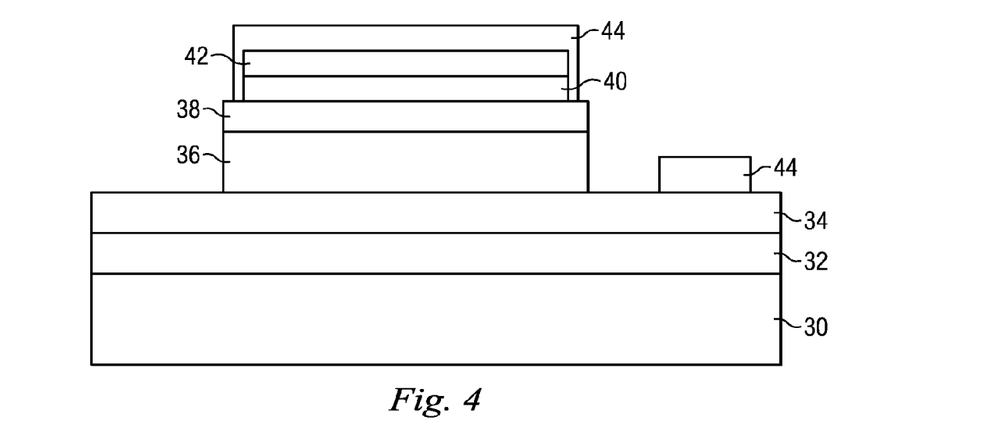
FIG. 4 shows a cross sectional view of a wafer after etching to define mesa structures to an n-GaN layer of LED dies and after depositing bonding metal using the method of FIG. 1 according to one or more embodiments of the present disclosure.

FIG. 4 shows a cross sectional view of a wafer after etching to define mesa structures to n-GaN layer of LED dies and after depositing bonding metal using the method of FIG. 1 according to one or more embodiments of the present disclosure. In particular, FIG. 4 shows a cross-sectional view of the epitaxial layers after step 14 of FIG. 1. In FIG. 4, the mesa structures of FIG. 3 are further etched down through p-doped GaN layer 38 and MQW active layer 36 to expose n-doped GaN layer 34. The mesa structures are etched using a process such as inductively coupled plasma (ICP) etching. After etching, the mesa structure consists of reflective mirror layer 42, p-contact metal layer 40, p-doped GaN layer 38, and MQW active layer 36.

A bonding metal layer 44 is deposited on the top surface of the mesa structures. Bonding metal layer 44 connects to p-contact metal layer 40 and may be used as p-contacts for wafer-level measurement of the LED dies. In addition, bonding metal layer 44 is used to bond diced LED dies to the silicon substrate in step 22 of FIG. 1. Bonding metal layer 44 may include gold, gold alloy, copper, copper alloy, nickel, nickel alloy, platinum, platinum alloy, titanium, titanium alloy, or combinations thereof, or it may use the same metals as those for P-contact metal layer 40. A bonding metal layer 44 is also deposited on the exposed n-doped GaN layer 34 and patterned to form n-contacts for wafer-level measurement of the LED dies. The p-contacts and n-contacts of bonding metal layer 44 enable wafer-level measurements of luminescence and electrical properties of each LED die on the wafer. Characterization of the LED dies before wafer dicing allows wafer-level binning rather than chip-level binning of the LED dies, simplifying the manufacturing process.

Figure 5:
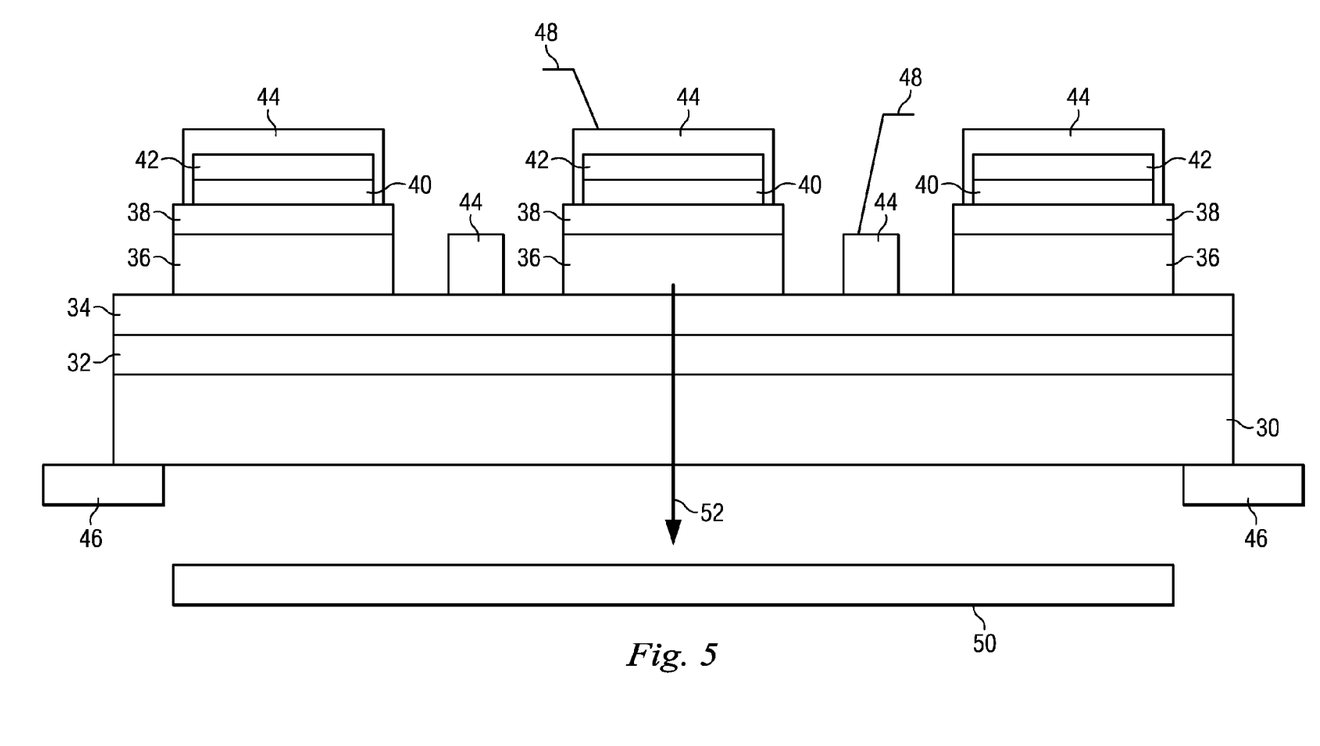
FIG. 5 shows a cross-sectional view of the wafer of FIG. 4 in a first method of wafer-level binning by measuring backside emitting light according to one or more embodiments of the present disclosure.

FIG. 5 shows a cross-sectional view of a wafer of FIG. 4 in a first method of wafer-level binning by measuring backside emitting light according to one or more embodiments of the present disclosure. The wafer of LED dies is supported on wafer holders 46. Probes 48 are connected to p-contacts and n-contacts of bonding metal layer 44 to supply power to p-doped GaN layer 38 and n-doped GaN layer 34, respectively. A detector 50 is placed on the backside of growth substrate 30 to measure the level of emitted light 52 from MQW active layer 36. Emitted light 52 travels through n-doped GaN layer 34, un-doped GaN layer 32, and growth substrate 30 to reach detector 50. Each of the LED dies may be measured for its luminescence and electrical properties such as its peak luminance, voltage, power, etc. The LED dies may be subsequently diced, sorted, binned, and packaged in accordance with the measured properties. For example, only LED dies with peak luminance level above a minimum threshold may be packaged into LED chips.

Figure 6:
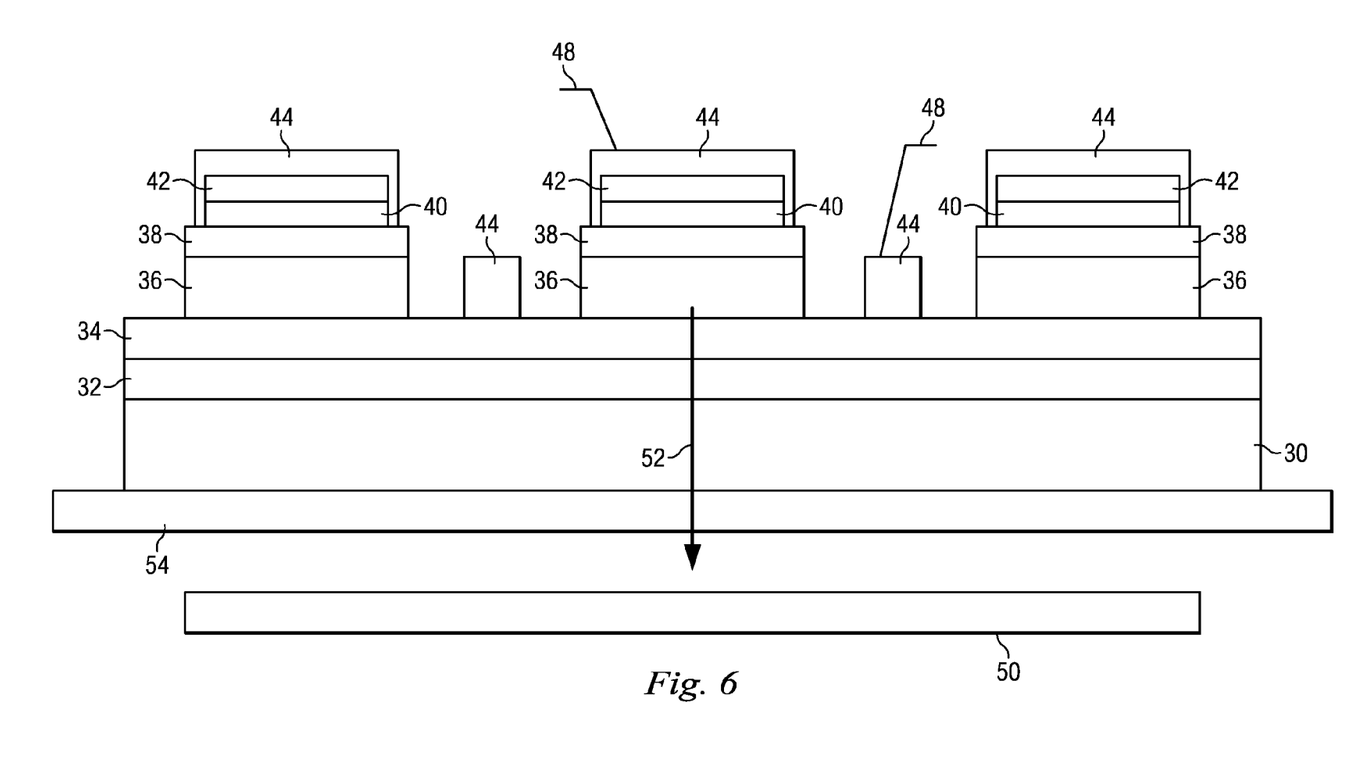
FIG. 6 shows a cross-sectional view of the wafer of FIG. 4 in a second method of wafer-level binning by measuring backside emitting light according to one or more embodiments of the present disclosure.

FIG. 6 shows a cross-sectional view of a wafer of FIG. 4 in a second method of wafer-level binning by measuring backside emitting light according to one or more embodiments of the present disclosure. The wafer of LED dies is supported on a transparent wafer holder 54 that is transparent to the wavelength of emitted light 52 from the LED dies. Similar to FIG. 5, probes 48 are connected to p-contacts and n-contacts of bonding metal layer 44. Also similar to FIG. 5, a detector 50 is placed on the backside of growth substrate 30. Emitted light 52 from MQW active layer 36 travels through n-doped GaN layer 34, un-doped GaN layer 32, growth substrate 30, and transparent wafer holder 54 to reach detector 50.

Figure 7:
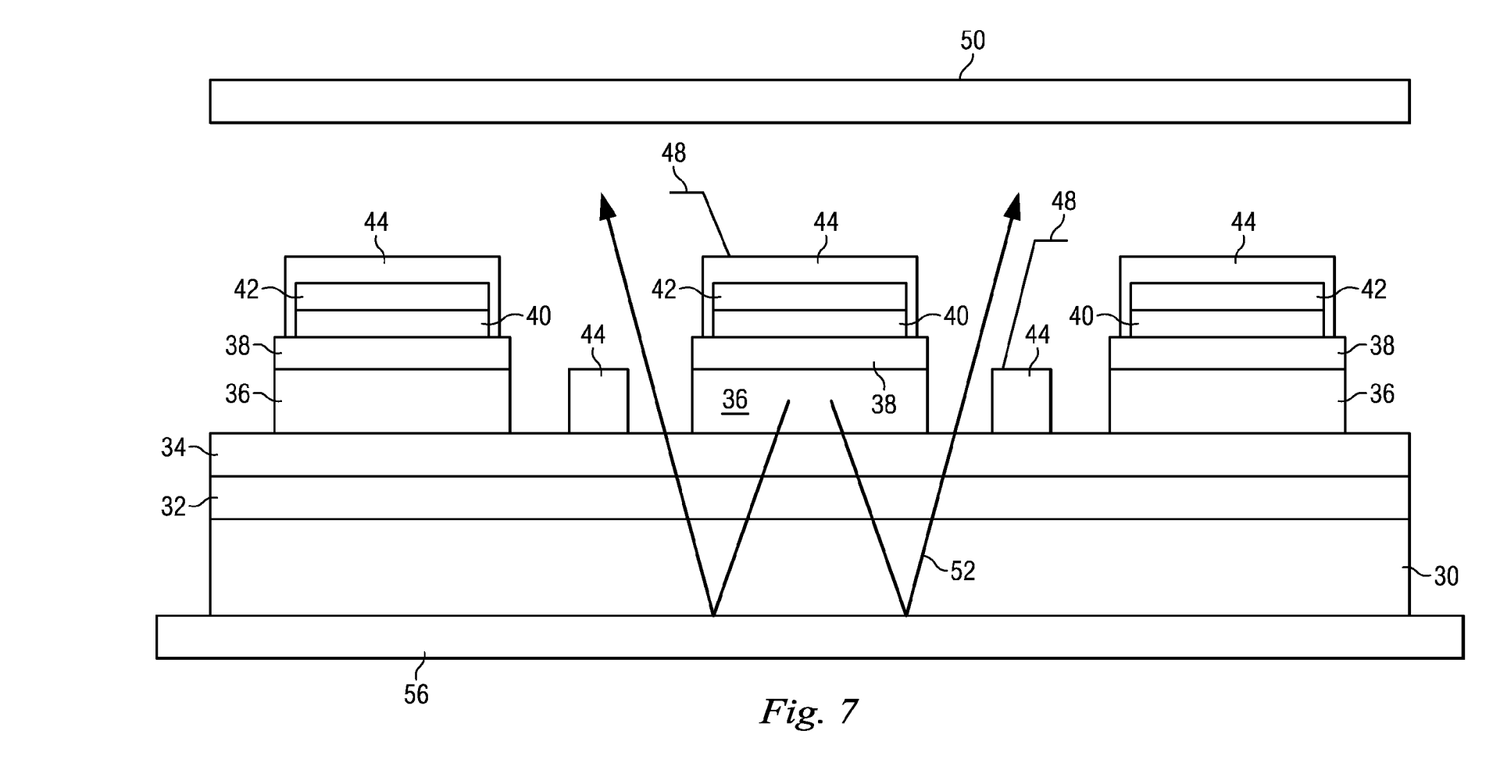
FIG. 7 shows a cross-sectional view of the wafer of FIG. 4 in a third method of wafer-level binning by measuring topside emitting light according to one or more embodiments of the present disclosure.

FIG. 7 shows a cross-sectional view of a wafer of FIG. 4 in a third method of wafer-level binning by measuring topside emitting light according to one or more embodiments of the present disclosure. The wafer of LED dies is supported on a reflective wafer holder 56 that reflects emitted light 52 from the LED dies. Similar to FIG. 5, probes 48 are connected to p-contacts and n-contacts of bonding metal layer 44. However, in contrast to FIGS. 5 and 6, a detector 50 is now placed on the same side as the epitaxial layers of the LED dies, commonly referred to as the topside of the wafer. Emitted light 52 from MQW active layer 36 travels through n-doped GaN layer 34, un-doped GaN layer 32, and growth substrate 30. Emitted light 52 is then reflected from reflective wafer holder 56 and travels backup through growth substrate 30, un-doped GaN layer 32, n-doped GaN layer 34, and through openings between mesa structures of LED dies to reach detector 50.

In FIGS. 5 and 6, emitted light 52 is detected on the backside. In FIG. 7, emitted light 52 is detected on the topside, but the emitted light 52 still travels through the backside to be reflected by reflective wafer holder 56. The presence of reflective mirror layer 42 prevents light emitted to the topside from having a direct path to a detector placed on the topside. One alternative embodiment to the epitaxial layers of FIG. 3 is to deposit the reflective mirror layer 42 only after wafer-level measurement so as to allow direct measurement of topside emitted light.

Figure 8:
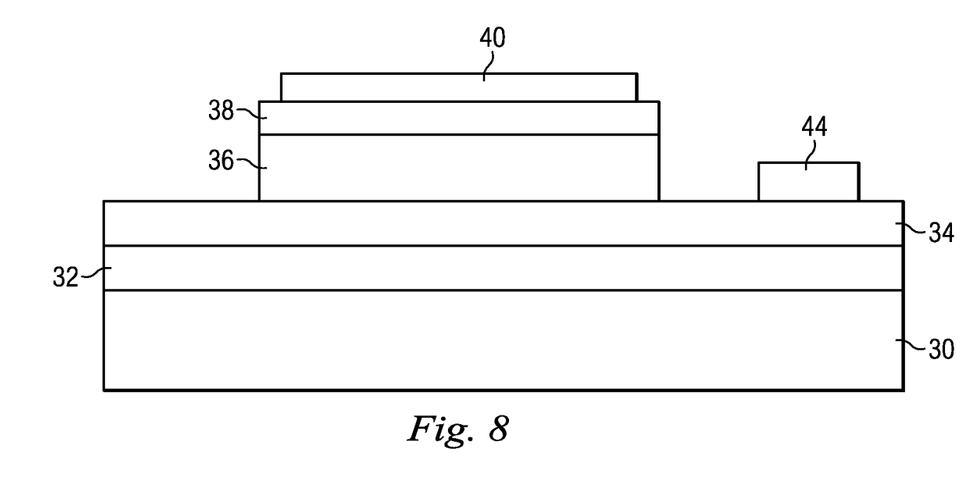
FIG. 8 shows a cross-sectional view of a wafer without a reflective mirror layer after depositing bonding material on an n-GaN layer of LED dies using an alternative method of FIG. 1 according to one or more embodiments of the present disclosure.

FIG. 8 shows a cross-sectional view of a wafer without a reflective mirror layer after depositing bonding material on n-GaN layer of LED dies using an alternative method of FIG. 1 according to one or more embodiments of the present disclosure. In this alternative embodiment, the reflective mirror layer is not deposited on p-contact metal layer 40 in step 10 of FIG. 1. P-contact metal layer 40 is still patterned and etching is still performed as in step 12 of FIG. 1 to define the mesa structures and to expose n-doped GaN layer 34. However, in contrast to step 14 of FIG. 1, a bonding metal layer 44 is not deposited on the top surface of the mesa structures since the top surface of the mesa structures already has p-contact metal layer 40. Rather, bonding metal layer 44 is only deposited on n-doped GaN layer 34 and patterned to form n-contacts for wafer-level measurement of the LED dies. Therefore, p-contact metal layer 40 and n-contact of bonding metal layer 44 connect with p-doped GaN layer 38 and n-doped GaN layer 34, respectively.

Figure 9:
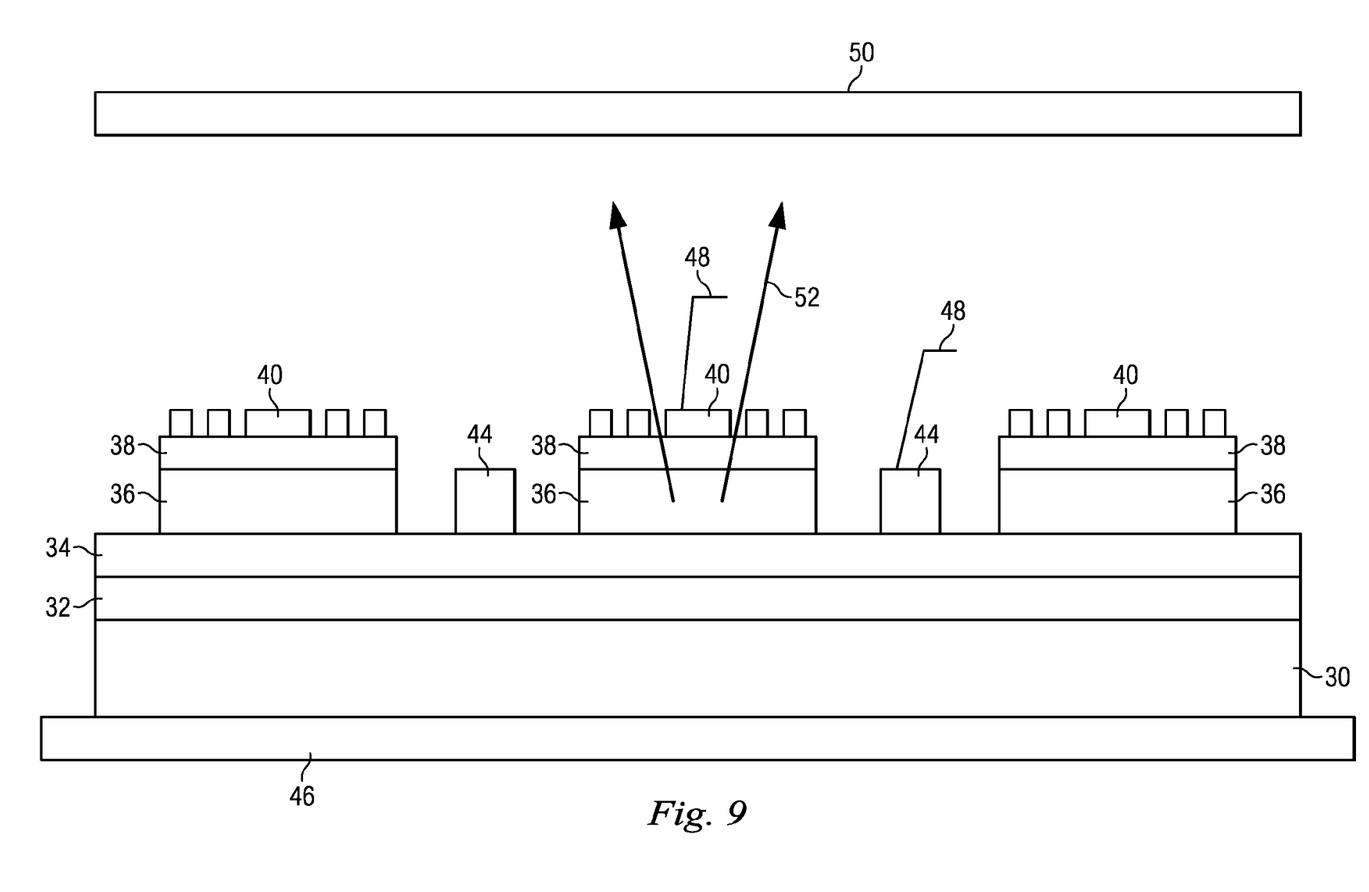
FIG. 9 shows a cross-sectional view of the wafer of FIG. 8 in a fourth method of wafer-level binning by measuring topside emitting light according to one or more embodiments of the present disclosure.

FIG. 9 shows a cross-sectional view of a wafer of FIG. 8 in a fourth method of wafer-level binning by measuring topside emitting light according to one or more embodiments of the present disclosure. In FIG. 9, p-contact metal layer 40 is further patterned into a metal mesh to allow topside emitted light to travel through p-contact metal layer 40. Probes 48 are connected to p-contact metal layer 40 and n-contact of bonding metal layer 44 to supply power to p-doped GaN layer 38 and n-doped GaN layer 34, respectively. Emitted light 52 from MQW active layer 36 travels through p-doped GaN layer 38 and through the metal mesh of p-contact metal layer 40 to a detector 50 placed on the topside.

Figure 10:
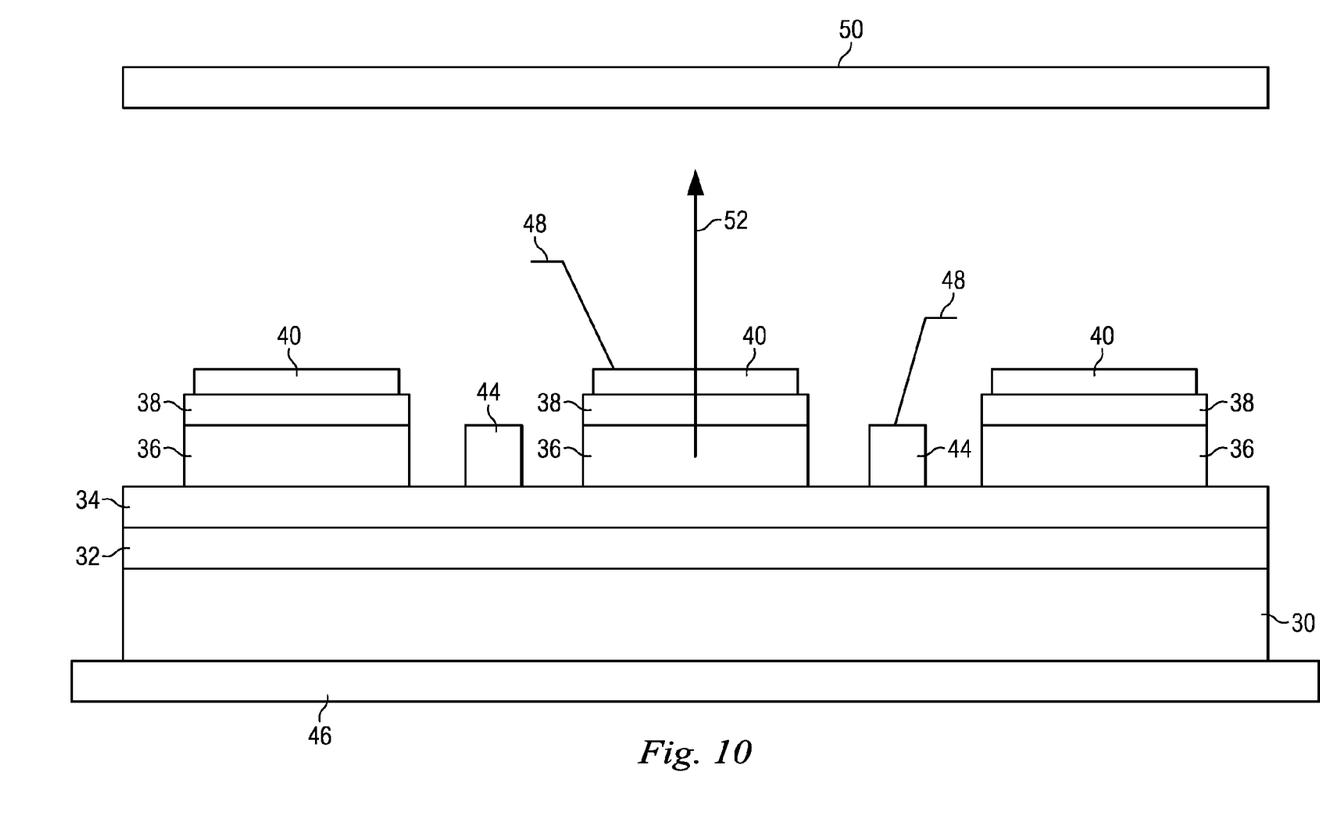
FIG. 10 shows a cross-sectional view of the wafer of FIG. 8 in a fifth method of wafer-level binning by measuring topside emitting light according to one or more embodiments of the present disclosure.

FIG. 10 shows a cross-sectional view of a wafer of FIG. 8 in a fifth method of wafer-level binning by measuring topside emitting light according to one or more embodiments of the present disclosure. In FIG. 10, p-contact metal layer 40 is made from semi-transparent conductive material such as thin nickel, or from transparent conductive material such as ITO. As before, probes 48 are connected to p-contact metal layer 40, now semi-transparent or transparent, and to n-contacts of bonding metal layer 44. Emitted light 52 from MQW active layer 36 travels through p-doped GaN layer 38 and through the semi-transparent or transparent p-contact metal layer 40 to a detector 50 placed on the topside.

In the wafer-binning methods of FIGS. 9 and 10, wafer-level measurements are made from topside without a reflective mirror layer or a bonding metal layer blocking the topside emitted light. However, for subsequent flipping and bonding of diced LED dies to the silicon substrate in step 22 of FIG. 1, a reflective mirror layer and a bonding metal layer are necessary. Therefore, after the wafer-level measurements, a reflective mirror layer is deposited on p-contact metal layer 40 and patterned to reflect emitted light from the LED dies. Reflective mirror layer may include the same materials as used in reflective mirror layer 42 of FIG. 4. Similarly, a bonding metal layer 44 is also deposited on reflective mirror layer and patterned for subsequent bonding of diced LED dies to the silicon substrate. Bonding metal layer may also include the same materials as used in bonding metal layer 44 of FIG. 4.

Figure 11:
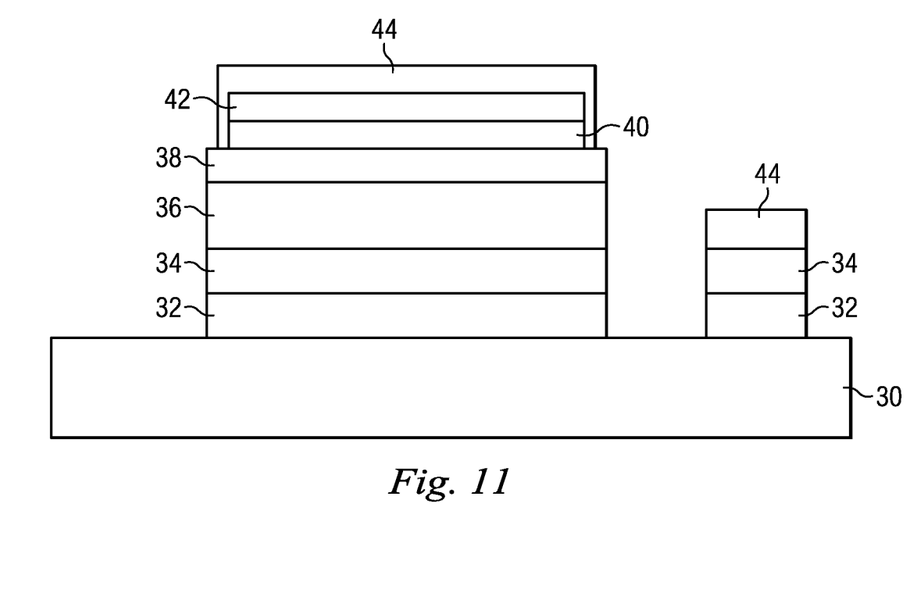
FIG. 11 shows a cross-sectional view of a wafer after etching to expose the growth substrate of LED dies using the method of FIG. 1 according to one or more embodiments of the present disclosure.

FIG. 11 shows a cross-sectional view of a wafer after etching to expose growth substrate of LED dies using the method of FIG. 1 according to one or more embodiments of the present disclosure. In particular, FIG. 11 shows a cross-sectional view of the epitaxial layers after step 18 of FIG. 1. The mesa structures and n-contacts of bonding metal layer 44 of FIG. 4 are further etched down through n-doped GaN layer 34 and un-doped GaN layer 32 in a second etching process to expose growth substrate 30. The etching process may use the same ICP etching process used for etching the mesa structures down to n-doped GaN layer 34 in FIG. 4 or step 12 of FIG. 1. After etching, the mesa structure consists of bonding metal layer 44, reflective mirror layer 42, p-contact metal layer 40, p-doped GaN layer 38, MQW active layer 36, n-doped GaN layer 34, and un-doped GaN layer 32. The n-contacts of bonding metal layer 44, and the underneath n-doped GaN layer 34, and un-doped GaN layer 32, may be removed or may be left intact.

Figure 12:
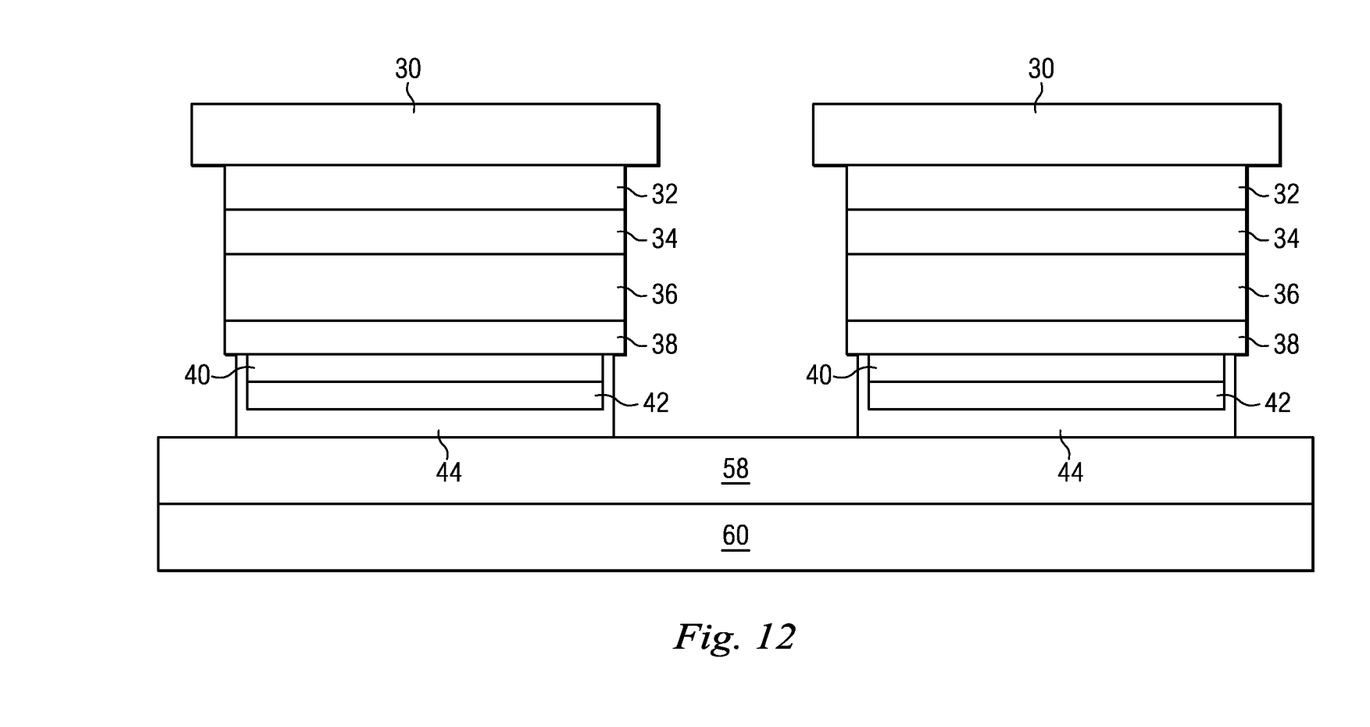
FIG. 12 shows a cross-sectional view of diced LED dies after bonding to a silicon wafer using the method of FIG. 1 according to one or more embodiments of the present disclosure.

FIG. 12 shows a cross-sectional view of diced LED dies after bonding to silicon wafer using the method of FIG. 1 according to one or more embodiments of the present disclosure. In particular, FIG. 12 shows a cross-sectional view of the epitaxial layers after step 22 of FIG. 1. To reduce the thickness of growth substrate 30 in preparation for wafer dicing, the backside of growth substrate 30 of FIG. 11 is grinded and polished. The thickness of growth substrate 30 after grinding and polishing may be reduced to 90-100 um. The wafer is then diced to yield diced LED die. The diced LED dies are binned according to their measured properties from the wafer-level measurement stage.

Diced LED dies with the desired measured properties are flipped and bonded to a wafer of silicon substrate 60. Alternatively, a wafer of substrate materials with high thermal conductivity such as copper or GaN may be used. Silicon substrate 60 may be patterned or embedded to have integrated circuits (IC) such as power IC for supplying power to the LED dies, and to have zener diodes for electrostatic protection of the LED dies. Silicon substrate 60 may be formed with interconnects within the substrate 60 before the diced LED dies are bonded. The interconnects within the substrate 60 provide electrical connections of the diced LED dies to external electrical power. In addition, fabrication processes that occur after bonding the LED dies to silicon substrate 60, including chip processes and package processes, can be done at the wafer level with mature silicon technologies.

A bonding metal layer 58 is deposited on silicon substrate 60 for bonding silicon substrate 60 to bonding metal layer 44 of the LED dies. Bonding metal layer 58 of silicon substrate 60 may include the same metals used for bonding metal layer 44 of the LED dies. After the LED dies are flipped and bonded to silicon substrate 60, the LED dies from top to bottom now consist of a thinned growth substrate 30, un-doped GaN layer 32, n-doped GaN layer 34, MQW active layer 36, p-doped GaN layer 38, p-contact metal layer 40, and reflective mirror layer 42.

Figure 13:
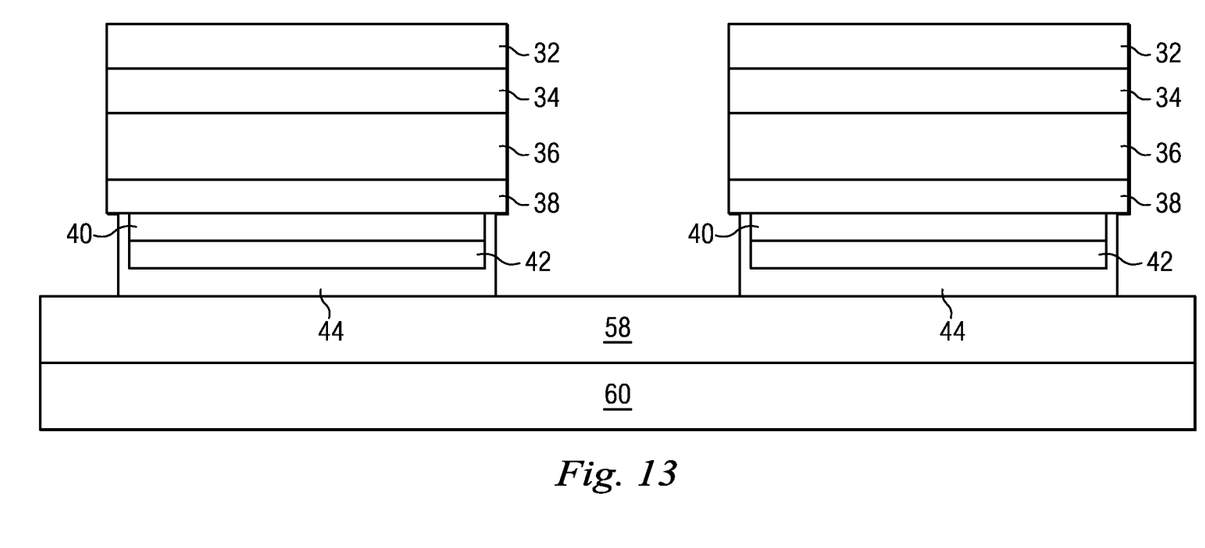
FIG. 13 shows a cross-sectional view of diced LED dies after a laser lift-off of growth substrate using the method of FIG. 1 according to one or more embodiments of the present disclosure.

FIG. 13 shows a cross-sectional view of diced LED dies after a laser lift-off of growth substrate using the method of FIG. 1 according to one or more embodiments of the present disclosure. In particular, FIG. 13 shows a cross-sectional view of the epitaxial layers after step 24 of FIG. 1, where the thinned growth substrate 30 of FIG. 12 is removed using a laser lift-off (LLO) process. Alternatively, growth substrate 30 may be removed using electromagnetic radiation or other processes. Removal of growth substrate 30 exposes un-doped GaN layer 32 as the top layer of the LED dies.

Figure 14:
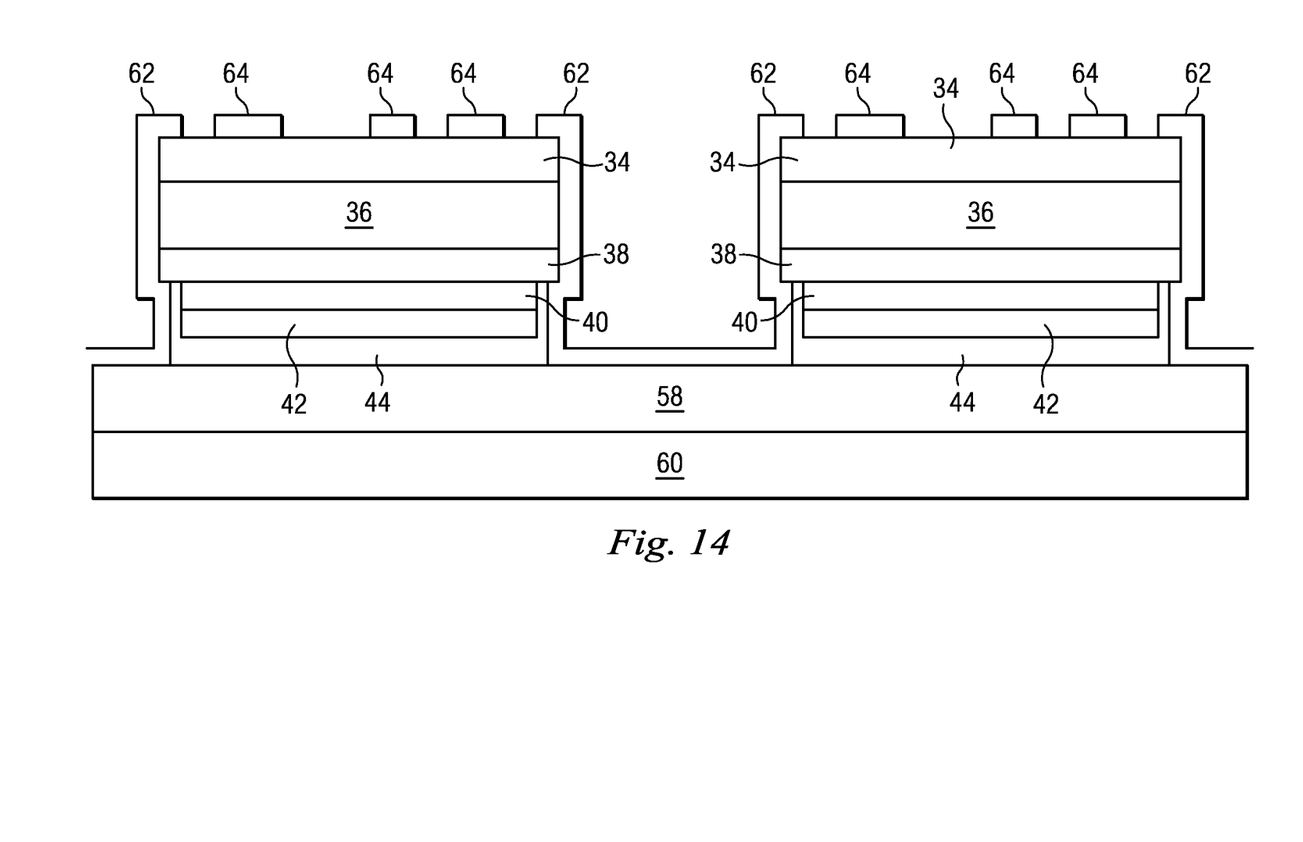
FIG. 14 shows a cross-sectional view of diced LED dies after removing an undoped GaN layer to expose a second n-GaN layer using the method of FIG. 1 according to one or more embodiments of the present disclosure.

FIG. 14 shows a cross-sectional view of diced LED dies after removing undoped GaN layer to expose n-GaN layer using the method of FIG. 1 according to one or more embodiments of the present disclosure. In particular, FIG. 14 shows a cross-sectional view of the epitaxial layers after step 26 of FIG. 1, where un-doped GaN layer 32 of FIG. 13 is removed using a etching process. The etching process may include wet etching or ICP. To protect other areas of the LED dies against the etching process, a first dielectric layer 62 is applied to the sidewalls of the LED dies and to areas between the LED dies. First dielectric layer 62 may include silicon oxide or other dielectric materials. Un-doped GaN layer 32 on top of the LED dies is unprotected by first dielectric layer 62 and is removed by the etching process. Removal of un-doped GaN layer 32 exposes n-doped GaN layer 34 as the top layer of the LED dies.

Exposed n-doped GaN layer 34 is to be roughened by an etching process to increase light extraction from the LED dies. However, n-contact electrodes also have to be deposited on n-doped GaN layer 34 to supply power to the LED dies. Therefore, to protect against the etching process, regions of n-doped GaN layer 34 receiving the n-contact electrodes are covered with a second dielectric layer 64. Second dielectric layer 64 may include the same materials as used for first dielectric layer 62, or it may use other dielectric materials. Because it may be desirable to have multiple n-contact electrodes on n-doped GaN layer 34 to spread current density, multiple regions of second dielectric layer 64 may cover n-doped GaN layer 34.

Figure 15:
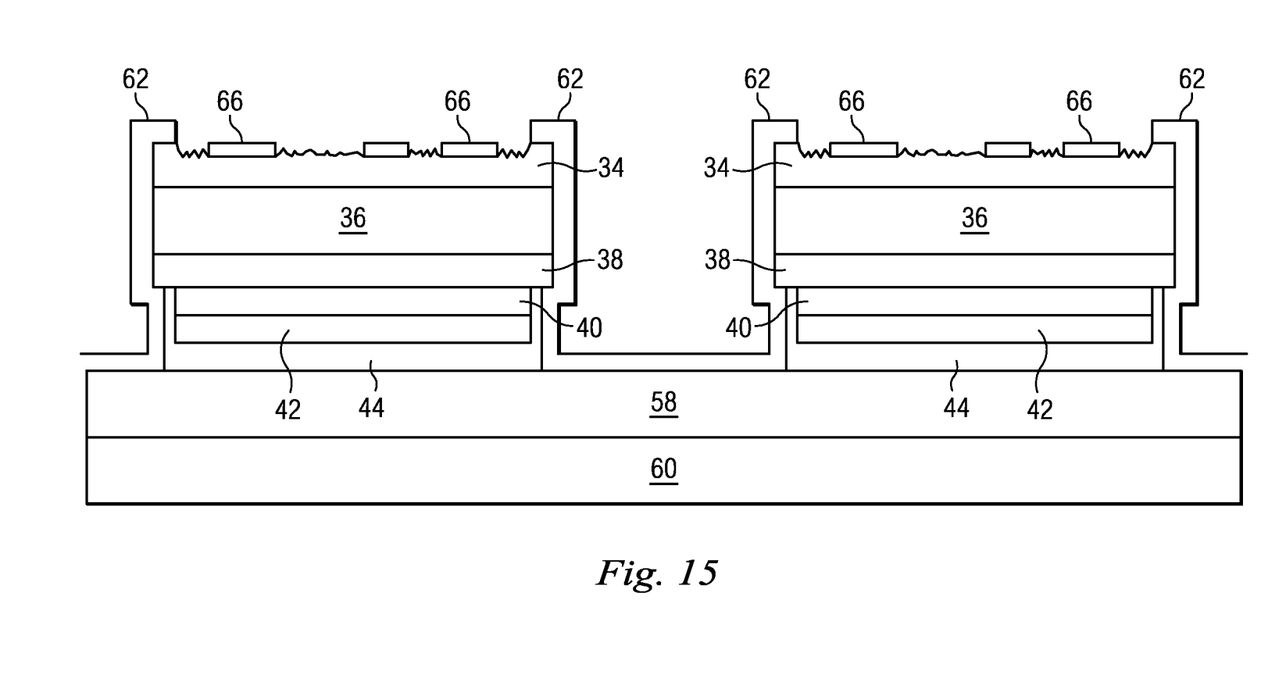
FIG. 15 shows a cross-sectional view of diced LED dies after roughening an n-GaN layer and depositing an n-contact metal using the method of FIG. 1 according to one or more embodiments of the present disclosure.

FIG. 15 shows a cross-sectional view of diced LED dies after roughening n-GaN layer and depositing n-contact electrodes using the method of FIG. 1 according to one or more embodiments of the present disclosure. In particular, FIG. 15 shows a cross-sectional view of the epitaxial layers after step 28 of FIG. 1. As mentioned, the surface of n-doped GaN layer 34 is roughened by an etching process to increase light extraction from the LED dies. When the surface of n-doped GaN layer 34 is smooth, it reflects light emitted by MQW active layer 36 downward, thus reducing the level of light extracted from the LED dies. Roughening of n-doped GaN layer 34 increases light extraction from the LED chips by scattering the emitted light outward and by reducing internal reflection. It is also understood that reflective mirror layer 42 reflects downward emitted light from MQW active layer 36 upward to further increase light extraction from the LED dies.

Areas of n-doped GaN layer 34 unprotected with second dielectric layer 64 of FIG. 14 are roughened by an etching process. The etching process may be a photo electrochemical etching process using potassium hydroxide (KOH). After the etching process, second dielectric layer 64 is removed and n-contact metal is deposited on the un-roughened regions of n-GaN layer 34 to form n-contact electrodes 66. Power to the LED dies may then be applied through n-contact electrodes 66 and through p-contact electrodes separately formed on silicon substrate 60.

Although embodiments of the present disclosure have been described, these embodiments illustrate but do not limit the disclosure. It should also be understood that embodiments of the present disclosure should not be limited to these embodiments but that numerous modifications and variations may be made by one of ordinary skill in the art in accordance with the principles of the present disclosure and be included within the spirit and scope of the present disclosure as hereinafter claimed.

We claim:

1. A method of fabricating a light emitting diode (LED) comprising:
   growing epitaxial layers comprising an n-doped layer, an active layer, and a p-doped layer on a wafer of a growth substrate;
   forming a p-contact to the p-doped layer;
   performing a wafer-level measurement of the LED by supplying power to the LED through the n-doped layer and the p-doped layer;
   dicing the wafer to yield a diced LED die;
   bonding the diced LED die to a substrate, wherein the substrate comprises interconnects formed within the substrate; and
   after the bonding, forming an n-contact to the n-doped layer.

2. The method of claim 1, further comprising growing a reflective mirror layer on the p-contact.

3. The method of claim 1, further comprising forming a dielectric layer on sidewalls of the diced LED die.

4. The method of claim 1, wherein said forming the p-contact comprises:
   growing a p-contact metal layer to electrically connect to the p-doped layer; and
   patterning the p-contact metal layer.

5. The method of claim 1, wherein said forming the n-contact comprises etching the epitaxial layers down to the n-doped layer and depositing a metal to electrically connect to the n-doped layer.

6. The method of claim 1, wherein said performing the wafer-level measurement comprises measuring emitted light from the active layer with a detector disposed on a backside of the growth substrate.

7. The method of claim 1, wherein said performing the wafer-level measurement comprises measuring emitted light from the active layer with a detector disposed on a topside of the growth substrate.

8. The method of claim 7, wherein said performing the wafer-level measurement further comprises patterning the p-contact to a metal mesh and measuring the emitted light through the metal mesh.

9. The method of claim 7, wherein the p-contact comprises a semi-transparent or transparent material and said performing the wafer-level measurement comprises measuring the emitted light through the p-contact.

10. The method of claim 1, wherein said bonding the diced LED die comprises flipping the diced LED die and bonding the diced LED die to the substrate using a bonding metal layer.

11. The method of claim 1, wherein the substrate comprises a silicon substrate with higher thermal conductivity than the growth substrate.

12. The method of claim 1, wherein the substrate has supporting circuitries for the diced LED die.

13. The method of claim 1, further comprising removing the growth substrate from the diced LED die.

14. The method of claim 13, wherein said removing the growth substrate comprises etching the diced LED die to expose the n-doped layer.

15. The method of claim 14, further comprising roughening the n-doped layer to increase light extraction from the diced LED die.

16. A method of binning light emitting diodes (LED) comprising:
provinding a plurality of LED dies on a first wafer, each of the plurality of LED dies comprising a p-type layer and an n-type layer;
supplying test power to each of the plurality of LED dies through the p-type layer and the n-type layer;
measuring a light emitted for each of the plurality of LED dies for wafer-level binning of each of the plurality of LED dies;
slicing the first wafer to separate the plurality of LED dies;
bonding, in response to the wafer-level binning, a selected subset of the LED dies to a second wafer with better thermal dissipation properties than the first wafer;
removing remaining portions of the first wafer from each of the LED dies bonded to the second wafer, thereby exposing a surface of the n-type layer; and
forming an electrode contact on the exposed surface of the n-type layer.

17. The method of claim 16, wherein measuring the light comprises disposing a detector on a topside of the first wafer.

18. The method of claim 16, wherein measuring the light comprises disposing a detector on a backside of the first wafer.

19. A light emitting diode (LED) die comprising:
epitaxial layers of semiconductor materials comprising an n-doped layer, an active layer, and a p-doped layer;
a plurality of regions of a dielectric material disposed on top of the epitaxial layers and along sidewalls of the LED die;
a reflective mirror layer disposed underneath the p-doped layer;
a substrate, wherein the substrate comprises interconnects formed within the substrate to provide electrical connections to the LED die;
a bonding metal layer disposed between the reflective mirror layer and the substrate to bond the LED die to the substrate;
a p-contact layer disposed between the reflective mirror layer and the p-doped layer; and
an n-contact layer disposed over the n-doped layer, wherein the n-doped layer, the active layer, and the p-doped layer are all located between the n-contact layer and the p-contact layer.

20. The LED die of claim 19, wherein the p-contact layer and the n-contact layer are disposed to provide electrical connections to the p-doped layer and the n-doped layer, respectively.

* * * * *